US008965595B2

(12) United States Patent
Wegelin

(10) Patent No.: US 8,965,595 B2
(45) Date of Patent: Feb. 24, 2015

(54) METHODS FOR MANAGING POWER CONSUMPTION FOR A HANDS-FREE DISPENSER

(75) Inventor: Jackson W. Wegelin, Stow, OH (US)

(73) Assignee: Gojo Industries, Inc., Akron, OH (US)

( * ) Notice: Subject to any disclaimer, the term of this patent is extended or adjusted under 35 U.S.C. 154(b) by 453 days.

(21) Appl. No.: 13/274,479

(22) Filed: Oct. 17, 2011

(65) Prior Publication Data

US 2013/0096729 A1 Apr. 18, 2013

(51) Int. Cl.
*G05B 11/00* (2006.01)
*A47K 5/12* (2006.01)
*H03K 17/94* (2006.01)
*H03K 17/945* (2006.01)

(52) U.S. Cl.
CPC ............ *A47K 5/1217* (2013.01); *H03K 17/941* (2013.01); *H03K 17/945* (2013.01); *H03K 2217/0036* (2013.01)
USPC ....................... 700/296; 222/639; 137/624.11

(58) Field of Classification Search
USPC .............. 700/231, 275, 283, 295, 296; 222/1, 222/638, 639, 644, 645, 646, 647, 648, 222/649; 239/1, 67, 69, 70; 137/624.11
See application file for complete search history.

(56) References Cited

U.S. PATENT DOCUMENTS

| | | | | |
|---|---|---|---|---|
| 4,666,099 A | * | 5/1987 | Hoffman et al. | ........... 242/564.1 |
| 4,786,005 A | * | 11/1988 | Hoffman et al. | ........... 242/564.1 |
| 4,921,150 A | * | 5/1990 | Lagergren et al. | ............ 222/639 |
| 5,255,822 A | * | 10/1993 | Mease et al. | .................... 222/63 |
| 5,397,028 A | * | 3/1995 | Jesadanont | ........................ 222/1 |
| 5,772,291 A | | 6/1998 | Byrd et al. | .................. 312/34.22 |
| 6,695,246 B1 | | 2/2004 | Elliott et al. | ................ 242/564.1 |
| 6,903,654 B2 | * | 6/2005 | Hansen et al. | ................. 340/562 |
| 7,040,566 B1 | * | 5/2006 | Rodrian et al. | ............... 242/563 |
| 7,370,824 B1 | * | 5/2008 | Osborne | ....................... 242/563 |
| 7,783,380 B2 | * | 8/2010 | York et al. | .................... 700/240 |

(Continued)

FOREIGN PATENT DOCUMENTS

DE 196 39 285 C1 4/1998 .............. E03C 1/05
WO WO 2007/006331 A1 1/2007 ............. H03K 17/94

OTHER PUBLICATIONS

*Perpetual Environmentally Powered Sensor Networks*; Jiang et al; Computer Science Department—University of California, Berkley, The Fourth International Conference On Information Processing in Sensor Networks: Special Track on Platform Tools and Design Methods for Network Embedded Sensors IPSN 2005: 463-468; Apr. 25-27, 2005.

(Continued)

*Primary Examiner* — Charles Kasenge
(74) *Attorney, Agent, or Firm* — Renner Kenner Greive Bobak Taylor & Weber

(57) ABSTRACT

Methods for managing power consumption of a battery-powered device such as a fluid dispenser are disclosed. One method includes setting a duty cycle of a sensor used by the device to a first range and setting a timer upon detection of a triggering event and also setting the duty cycle to a triggering event and also setting the duty cycle to a second range. The method continues by checking for another triggering event during the second range. The checking step is repeated if the timer has not lapsed, but if the timer has lapsed the process returns to the setting step. Related methods may be used to adjust the duty cycle based upon a detected characteristic such as light, sound, motion or time.

8 Claims, 4 Drawing Sheets

(56) References Cited

U.S. PATENT DOCUMENTS

| | | | |
|---|---|---|---|
| 7,837,065 B2* | 11/2010 | Furner et al. | 222/52 |
| 7,898,407 B2* | 3/2011 | Hufton et al. | 340/539.11 |
| 7,954,667 B2* | 6/2011 | Furner et al. | 222/52 |
| 8,061,562 B2* | 11/2011 | Carpenter et al. | 222/52 |
| 8,087,543 B2* | 1/2012 | Yang et al. | 222/52 |
| 8,096,445 B2* | 1/2012 | Yang et al. | 222/52 |
| 8,109,411 B2* | 2/2012 | Yang et al. | 222/52 |
| 8,237,558 B2* | 8/2012 | Seyed Momen et al. | 340/539.11 |
| 8,342,363 B2* | 1/2013 | Carpenter et al. | 222/52 |
| 8,459,499 B2* | 6/2013 | Sipinski | 222/1 |
| 2003/0167893 A1 | 9/2003 | Morris et al. | 83/649 |
| 2003/0168549 A1* | 9/2003 | Formon et al. | 242/563 |
| 2003/0168550 A1* | 9/2003 | Formon et al. | 242/564.1 |
| 2005/0171634 A1* | 8/2005 | York et al. | 700/231 |
| 2006/0076366 A1* | 4/2006 | Furner et al. | 222/402.13 |
| 2006/0173576 A1* | 8/2006 | Goerg et al. | 700/236 |
| 2007/0199952 A1* | 8/2007 | Carpenter et al. | 222/52 |
| 2007/0235555 A1* | 10/2007 | Helf et al. | 239/102.2 |
| 2008/0253934 A1* | 10/2008 | DiTrolio et al. | 422/100 |
| 2009/0026305 A1 | 1/2009 | Elliott et al. | 242/563.2 |
| 2009/0198373 A1* | 8/2009 | Mok et al. | 700/231 |
| 2010/0038379 A1* | 2/2010 | Butler et al. | 222/52 |
| 2010/0168926 A1 | 7/2010 | Bayley et al. | 700/282 |
| 2010/0243673 A1* | 9/2010 | Furner et al. | 222/1 |
| 2010/0243674 A1* | 9/2010 | Furner et al. | 222/1 |
| 2010/0268381 A1* | 10/2010 | Goerg et al. | 700/244 |
| 2011/0095044 A1* | 4/2011 | Sipinski | 222/1 |
| 2011/0132992 A1* | 6/2011 | Hoppe et al. | 239/6 |
| 2011/0284653 A1* | 11/2011 | Butler et al. | 239/34 |
| 2012/0000932 A1* | 1/2012 | Carpenter et al. | 222/52 |
| 2012/0091219 A1* | 4/2012 | Sipinski et al. | 239/34 |

OTHER PUBLICATIONS

*Power Enhancement of an Actively Controller Battery/Ultracapacitor Hybrid*; Gao et al; IEEE Transactions On Power Electronics; vol. 20, No. 1, Jan. 2005, pp. 236-243.

International Search Report mailed Oct. 2, 2013 in corresponding application PCT/US2012/057684.

Written Opinion mailed Oct. 2, 2013 in corresponding application PCT/US2012/057684.

* cited by examiner

METHODS FOR MANAGING POWER CONSUMPTION FOR A HANDS-FREE DISPENSER

TECHNICAL FIELD

Generally, the present invention is directed to an electrically powered hands-free fluid dispenser. In particular, the present invention provides a dispenser with a user sensor that utilizes an adjustable duty cycle to control power management. Specifically, the present invention is directed to a dispenser and method for using the same which includes a user sensor that has an adjustable duty cycle to provide improved response time during busy periods of use and reduced power consumption during extended periods of non-use.

BACKGROUND ART

Hands-free, sometimes referred to as touch-free, dispensers are well known in the art. Many of these dispensers are battery powered which allow them to be conveniently placed most anywhere without connection to electrical service. Of course, batteries, also referred to as cells, run down over a period of time and this requires that the batteries be replaced. If a battery is not timely replaced then the dispenser is rendered inoperative. One way to overcome this problem is to replace the battery on a predetermined schedule. However, this is considered wasteful as the full life of the replaced battery is not used.

In the context of hands-free dispensers, it has been determined that a user sensor preferably responds within 200 milliseconds upon detection of a target and dispenses a fluid such as a soap. This requires that the user sensor wake and detect a target at least four times per second. However, user sensors that detect slower events, like flush valves, respond in one second or more to a target. This allows for a lower duty cycle and thus lower power consumption. This same lower duty cycle can be used with a soap dispenser; however, skilled artisans will appreciate that this results in lost opportunities to provide soap to a user. In other words, users frequently like to receive a second dispensing of soap prior to exposing their hands to water and washing their hands. Additionally, it has been found that a user prefers to receive a second dose of soap more quickly than the first.

Current devices that provide for fluid soap dispensing utilize the same duty cycle whether the dispensing device is busy or not. Accordingly, more electrical power is used even though the dispenser may not be utilized for significant periods of time. Indeed, a particular prior art fluid dispenser, such as one that uses an infrared detection sensor, utilizes ten thousand times more current when it is on, than when it is off. In any event, some washrooms or restrooms only see extended or busy activity during weekends and are dormant during the rest of the week. Additionally, some dispensers may be more busy during certain periods of the year such as summertime in park-like settings and not busy during the wintertime. Moreover, skilled artisans will appreciate that the duty cycle determines the response time for when the user places their hand underneath the infrared sensor. Moreover, when the sensor is not in use, it is necessary to keep the sensor on in some type of duty cycle to keep the sensor calibrated to the ambient environment. Although some prior devices acknowledge the need for turning on a sensor or turning off a sensor, there is little appreciation as for the need to maintain calibration of the sensor. Therefore, there is a need to extend battery life for hands-free dispensers. Moreover, there is a need for the ability to adjust a duty cycle to reduce power consumption during non-use of the dispenser and to increase duty cycle during periods of extended use.

SUMMARY OF THE INVENTION

In view of the foregoing, it is a first aspect of the present invention to provide methods for managing power consumption for a hands-free dispenser.

Another aspect of the present invention is to provide a method for managing power consumption of a battery-powered device, comprising providing a battery-powered device that must remain in a condition to detect the presence of a user with a sensor so as to dispense a product setting a duty cycle of said sensor to a first range, starting a timer upon detection of a user by a triggering event and setting said duty cycle to a second range, checking for the presence of another triggering event with said duty cycle set to said second range, repeating the checking step if said timer has not lapsed, and returning to said setting step when said timer has lapsed.

Yet another aspect of the present invention is to provide a method for managing power consumption of a battery-powered dispenser, comprising providing a battery-powered device that must remain in a condition to detect the presence of a user with a sensor so as to dispense a product, setting a duty cycle of said sensor to a first range, checking a detected characteristic of another sensor after checking for a triggering event by said sensor, and adjusting said duty cycle to a second range depending upon a status of said detected characteristic present.

BRIEF DESCRIPTION OF THE DRAWINGS

For a complete understanding of the objects, techniques and structure of the invention, reference should be made to the following detailed description and accompanying drawings, wherein.

BEST MODE FOR CARRYING OUT THE INVENTION

Figure 1:
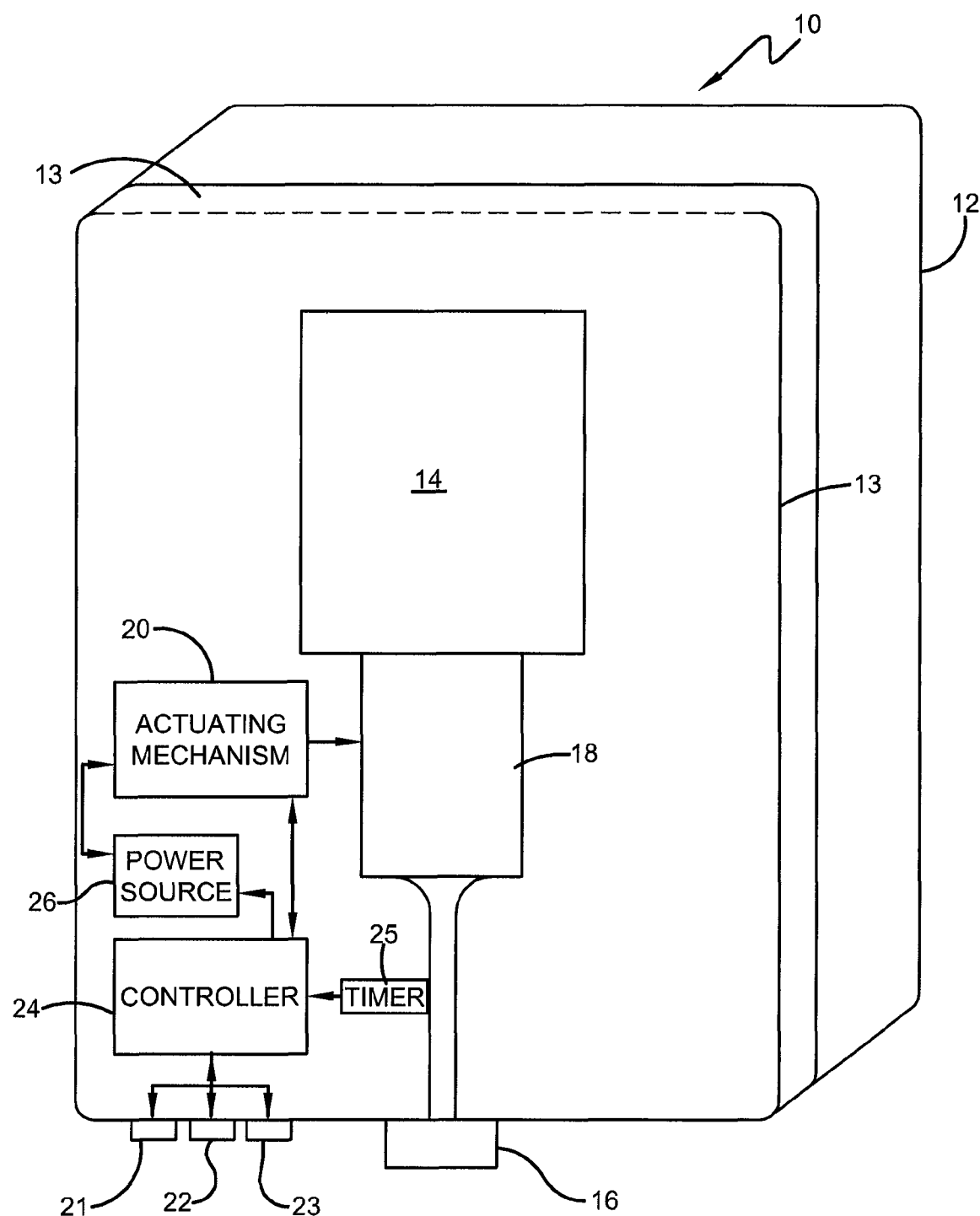
FIG. 1 is a schematic diagram of a dispenser made according to the concepts of the present invention, wherein a cover of the dispenser is partially shown in phantom to show the dispenser's internal components.

Referring now to the drawings and in particular to FIG. 1 it can be seen that a touch-free dispenser made in accordance with the concepts of the present invention is designated generally by the numeral 10. Although the concepts of the present invention are directed to a touch-free or hands-free dispenser, skilled artisans will appreciate that the present invention may also be utilized in any device which is battery operated or uses power from a source other than conventional mains power to power at least one electrical component. In other words, the present invention may be utilized with any device which consumes power from a limited source. In any event, the dispenser 10 includes a housing 12 which provides a cover or door 13 that when open allows a technician to install or replace a refill container 14. The container 14, which may also be referred to as a cartridge, contains a fluid material such as a soap, a sanitizer or other material that is dispensed in measured amounts. Associated with the refill container 14 is a nozzle 16 which is a conduit from the container to an object receiving the fluid such as a user's hands or any other object upon which the fluid is dispensed. As used herein, the term "user" refers to a person or object detected by the dispenser so as to initiate a triggering event. In other words, the dispenser detects the presence of a user or an object in close proximity to where the fluid material is dispensed and the dispenser determines that the user or object intends to receive the fluid. It will further be appreciated that a user may be a single person, or object who actuates the dispenser once or repeatedly, or multiple users or objects that are detected, one after the other. As such, a "second" user may in fact be the first user. In any event, the dispenser 10 includes a pump mechanism 18 which is interposed between the container 14 and the nozzle 16. The mechanism 18 is coupled to an actuating mechanism 20 such as a motor or solenoid that actuates the pump mechanism.

A proximity sensor 21 is associated with the housing 12 and may be in the form of an infrared, sonic, or capacitive type sensor which detects the presence of an object or the user's hands. An ambient light sensor 22 may be carried by the housing 12 for the purpose of determining whether lights are on and/or whether it is daytime. Presumably, if sufficient ambient light is detected, indicating that it is daytime or that a light is on, the dispenser will likely be used more frequently. A motion detection sensor 23 may also be carried by the housing 12 for the purpose of determining whether potential users are moving in close proximity to the housing. If so, it is presumed that the dispenser will likely be used more frequently.

A controller 24 is carried by the housing and is connected to the proximity sensor 21, the ambient light sensor 22, the motion detector 23, the actuating mechanism 20 and the pump mechanism 18. A timer 25 is connected to the controller 24 and may be used to facilitate the power management goals of the dispenser. The timer 25 may be able to track one or more events simultaneously and generate a signal indicating that a designated time period has expired. Skilled artisans will appreciate that all the functions needed to implement the timer may be incorporated or provided directly by the controller 24. As will be described, the ambient light sensor 22, the motion detection sensor 23, the timer 25 and any other device that detects some change in a physical characteristic or lapsing of time can be used to change an operational duty cycle of the proximity sensor and/or other component of the dispenser so as to reduce and manage power consumption of the dispenser.

A power source 26, which will be discussed in further detail, provides electrical power to the sensors 21, 22 and 23 via the controller 24; the controller 24; the pump mechanism 18; and the actuating mechanism 20. The power source 26 includes one or more batteries, which may be referred to as cells throughout the specification. The batteries used for the power source may be recharged by solar cells or by other means.

In general, the controller 24 and the appropriate sensor are used to control and manage the electrically powered components associated with the dispenser 10. These components include, but are not limited to the pump mechanism, the actuating mechanism, the sensor 21, the ambient light sensor 22, the motion detector 23 and the controller 24. It will be appreciated that the features of the dispenser 10 are applicable to other devices that are not dispensers or that are not hands-free dispensers or devices. Indeed, the present invention may be utilized with any device that relies on batteries or cells for power for extended periods of time. Generally, the controller 24 monitors operation of the sensors 21, 22 and 23, either singly or together, so as to manage and conserve the amount of power required to operate the dispenser. And the controller 24 may be configured to adjust operation during use to ensure a faster than normal response to input from users that indicate higher than normal usage. The controller 24 and the sensor 21, with or without the other sensors 22 and 23, work together to adjust the duty cycle of the sensor 21. Accordingly, at least two duty cycles may be used in the following embodiments. The duty cycles may have different ranges but they typically do not overlap one another. For example, a normal duty cycle may result in the sensor 21 generating an infrared beam, or other physical characteristic, three to five times every second. Other duty cycles may generate physical characteristics more or less often as needed.

Figure 2A:
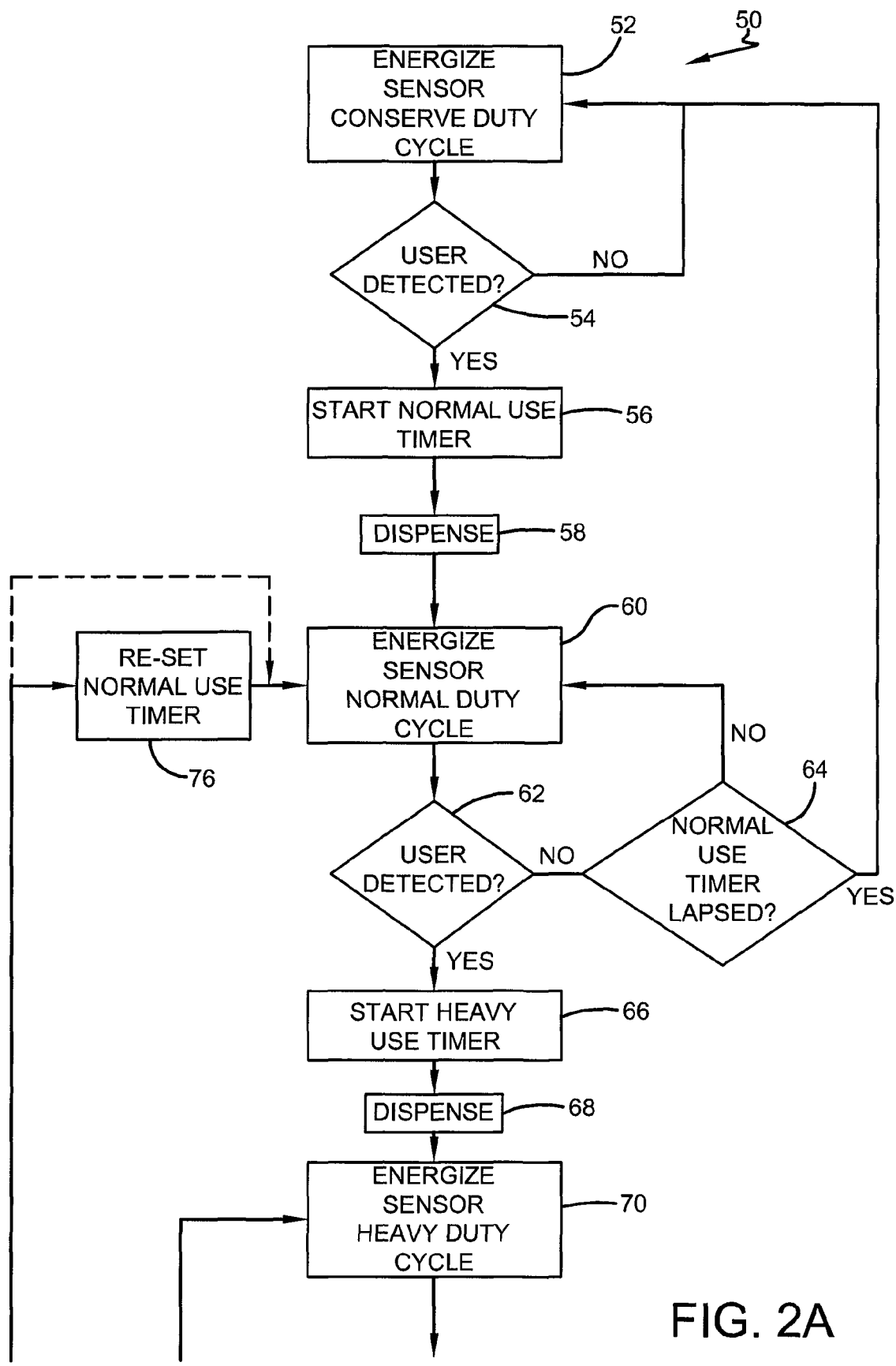
FIGS. 2A and 2B present an operational flow chart for managing power consumption based on frequency of use of the dispenser according to the concepts of the present invention.
Figure 2B:
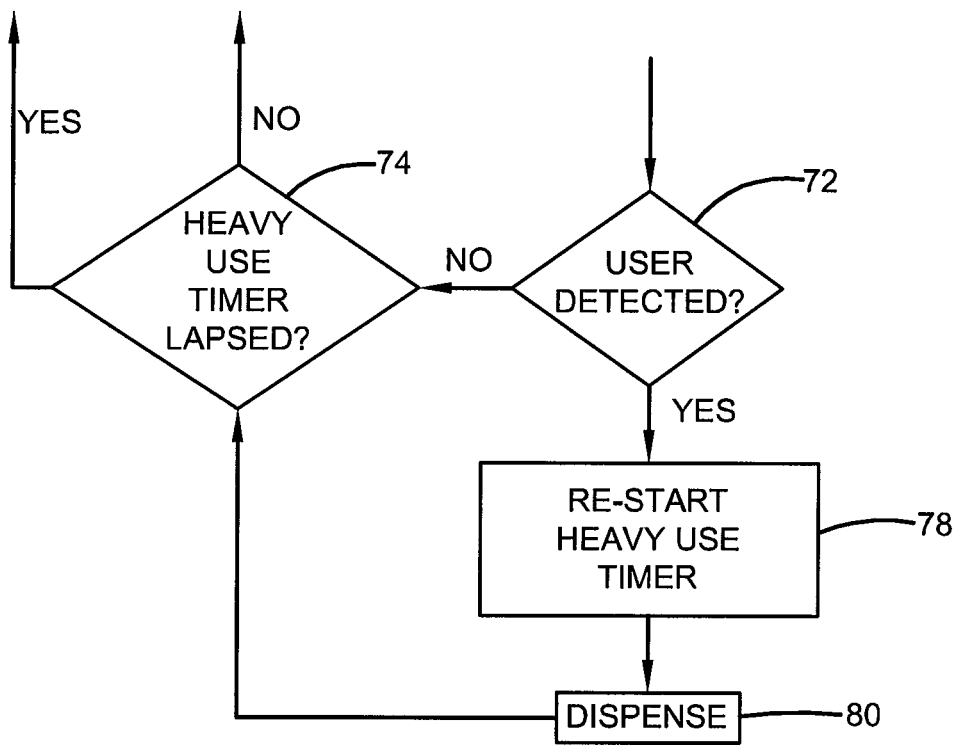

Referring now to FIGS. 2A and 2B it can be seen that an operational flow chart for managing power consumption of a hands-free dispenser is designated generally by the numeral 50. Initially, the sensor 21 is energized so as to operate at a conserve duty cycle. In the present embodiment, the conserve duty cycle ranges from once every two seconds to once every half second or two times per second. Skilled artisans will appreciate that the conserve duty cycle may be adjusted such that the sensor checks for a detectable physical characteristic to an appropriate time period. Next at step 54, the controller determines whether a user is detected by the sensor 21. If not, then the process returns to step 52.

However, if at step 54 a user is detected, then at step 56 a normal use timer is initiated at step 56. Although any time value can be used for the normal use timer, in the present embodiment it is believed that one hour would be an appropriate time period. Next at step 58, the controller 24 energizes the actuating mechanism and the pump mechanism so as to dispense a predetermined quantity of fluid. Upon completion of step 58, the sensor 21 is energized so as to operate at a normal duty cycle which in the present embodiment is four times each second but skilled artisans will appreciate that it can be in any range such as three to five times per second. Accordingly, for at least the next hour (the running of the normal use timer), the sensor utilizes a duty cycle of anywhere from three to five times per second. Upon completion of the energization step, the controller operates at the normal duty cycle and determines whether a user is detected or not at step 62. If a user is not detected at step 62, then the process 50 goes to step 64 to determine whether the normal use timer has lapsed or not. If the normal use timer has not lapsed, then the process returns to step 60. However, if the normal use timer (set at step 56) has now lapsed, then the process returns to step 52 and the sensor is returned to the conserve duty cycle, that is, the duty cycle ranges from once every two seconds to once every half second.

If at step 62 a user is detected, than at step 66 a heavy use timer is started. In the present embodiment, the heavy use timer may be set for any time period, such as five minutes, wherein the heavy use timer uses a time period less than the normal use timer and typically much less than the normal use time period. In any event, after starting the timer at step 66, the controller instructs the actuating mechanism 20 and the pump mechanism 18 to dispense a predetermined quantity of fluid. Subsequently, at step 70, the sensor 21 is energized so as to initiate a heavy use duty cycle. In the present embodiment, the heavy use duty cycle results in the sensor 21 being activated six to eight times every second. In other words, the sensor 21 is activated at least once every 125 to every 167 milliseconds. Upon completion of step 70, the controller again inquires whether another user, which may be the same user or a different user, is detected or not at step 72. If a user is not detected, then the process continues to step 74 to determine whether the heavy use timer has lapsed or not. If the heavy use timer has not lapsed, then the process returns to step 70. However, if the heavy use timer has lapsed at step 74, then the process goes to step 76 and the normal use timer is reset. In most instances, the normal use timer may be set to the same time period value as set in step 56. Or some other time period, typically shorter, could be used. In the alternative, the normal use timer could be allowed to run concurrently with the running of the heavy use timer and step 76 could be bypassed as indicated by the dashed line. Upon completion of this step, then the process goes to step 60 so as to energize the sensor to actuate at the normal duty cycle.

If at step 72 a user is detected then the process restarts the heavy use timer at step 78 and dispenses a predetermined quantity of fluid at step 80. Upon completion of step 80, the process returns to step 74 to determine the status of the heavy use timer and the process continues as described previously.

Skilled artisans will appreciate then that the process 50 generally has three operational loops within the flow chart. The first operational loop operates on the conserve duty cycle and stays in that loop until a user is detected. Upon detection, the dispenser operates in a normal duty cycle (the second loop) where the dispenser operates in a normal fashion until such time that an extended period of non-use has occurred. When this period of non-use has elapsed, then the process returns to the conserve duty cycle so as to save power. In order to address the needs of a heavy use scenario, the normal duty cycle may be elevated to heavy use so as to quickly dispense fluid material when a number of users are detected within a predetermined period of time. This third loop, which comprises steps 62 through 80, continues until the heavy use timer lapses so as to return to a normal use mode.

These three different duty cycle ranges are advantageous for saving power during extended periods of non-use and quick response times during periods of heavy use. This ability to adjust duty cycles reduces battery consumption when the battery is not being used but also allows for dispensing of more fluid material during heavy periods of use.

Instead of relying solely on use activity, the dispenser 10 may also utilize other sensors to assist in conserving or managing battery power. In particular, referring now to FIG. 3, it can be seen that an alternate method for operating the dispenser is designated generally by the numeral 100. At step 102, an ambient light or sound, or other detectable physical characteristic is detected. Specifically, the controller determines whether the characteristic detected exceeds a high threshold level or a low threshold level. In other words, if a certain amount of light exceeds a predetermined threshold, then a high value is detected or the certain value of light is below the threshold then a low value is determined. The same criteria can be used for sound. Accordingly, if a high value is determined it is presumed that a light is on in the area or sun light sufficiently illuminates the area associated with the dispenser, or that a number of individuals associated with a certain level of sound are in relevantly close proximity to the dispenser and it is likely it will be used in the immediate future. As such, at step 102 if a high value is detected, then the controller energizes the sensor utilizing a normal duty cycle at step 104. The normal duty cycle, as set out above, results in the sensor being energized in a certain range, such as three to five times each second. At step 106, the controller awaits to determine whether a user is detected or not. If a user is not detected, then the process returns to step 102 and the sensor continues to operate on the normal duty cycle. If however, at step 106 a user is detected then the device operates so as to dispense a predetermined quantity of fluid at step 108 and then the process returns to step 102.

If at step 102 a low value is detected by the ambient light or sound sensor, then the process continues to step 110 so as to energize the sensor with a conserve duty cycle. As in the previous embodiment, the conserve duty cycle will likely be once every half second to one every two seconds. The process then continues to step 106 to determine whether a user is detected or not as described above. As such, it will be appreciated that even if there is a quiet environment or the ambient light level is low, the user or the apparatus can still be operated.

The physical characteristic set out in step 102 may include the characteristic of time. As such, step 102 may provide for a timing function to determine whether the dispenser is being used frequently or not. In this embodiment, the process includes a step 107 of starting a timer after a user is detected at step 106. The time period may be as short as a few seconds or as long as a few hours. In any event, when use of the timer is implemented, as the detected characteristic, the query at step 102 becomes a determination as to whether the timer has lapsed or is still running. If the timer has lapsed, then the conserve duty cycle is implemented at step 110. If the timer is still running, then the normal duty cycle is utilized at step 104.

Figure 3:
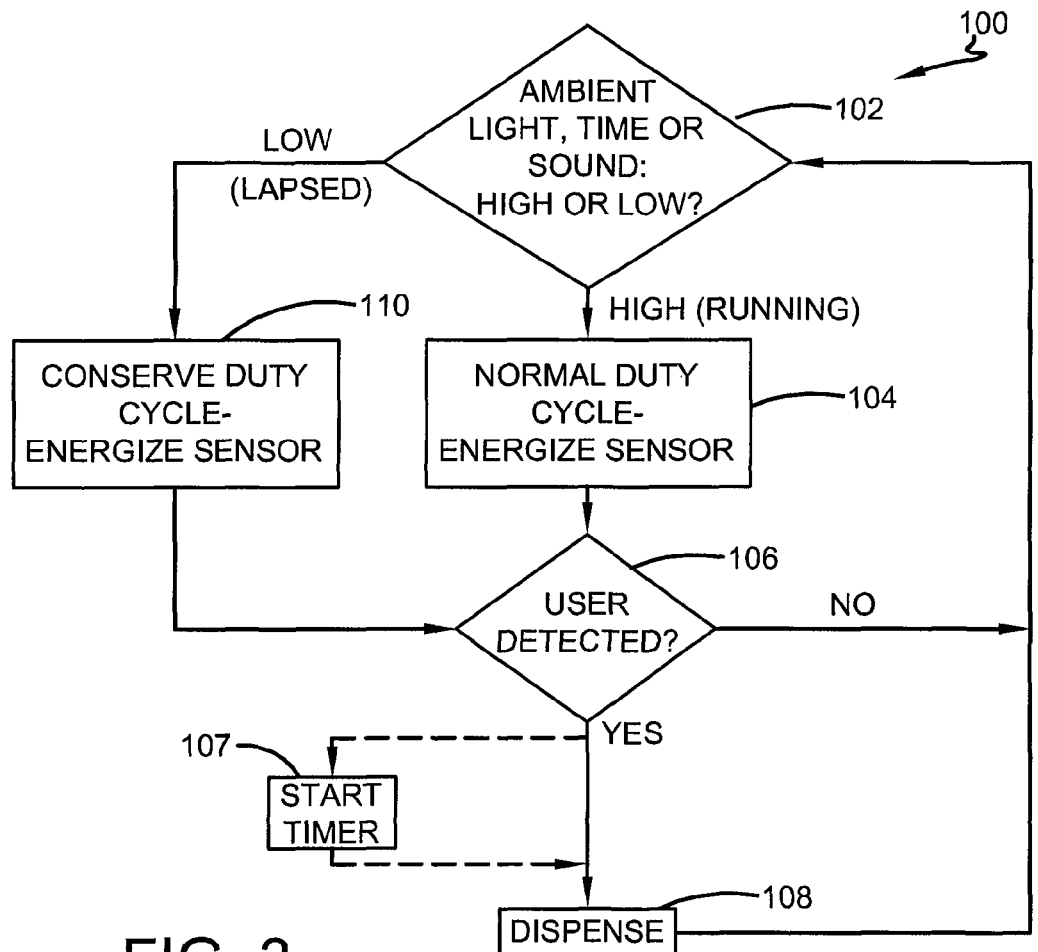
FIG. 3 is another embodiment showing an operational flow chart for managing power consumption based upon ambient light levels or other physical characteristics according to the concepts of the present invention.

FIG. 3 provides for two main operational loops depending upon whether some threshold value of a physical characteristic is met or not. If the threshold value is met—light, sound or running timer—then the operational loop uses a normal duty cycle. If not, then the operational loop utilizes the conserve duty cycle.

Figure 4:
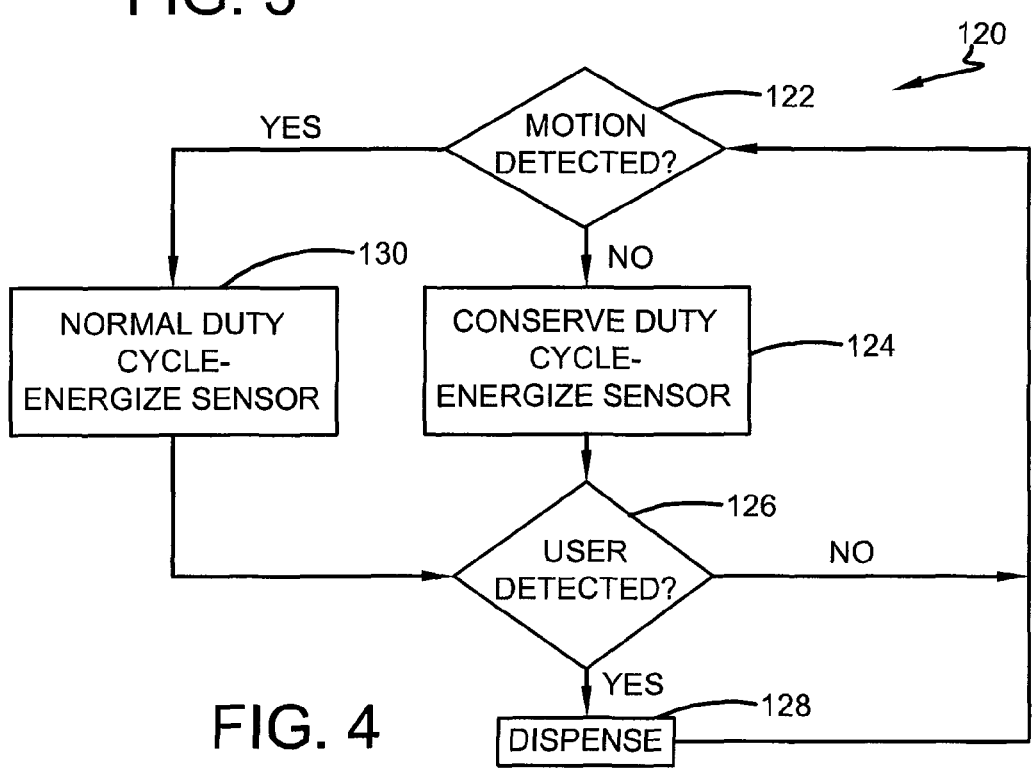
FIG. 4 is a further embodiment for managing power consumption according to the concepts of the present invention based upon a motion of detection sensor maintained by the dispenser according to the concepts of the present invention.

Referring now to FIG. 4, yet another embodiment provides a method for managing power as designated generally by the numeral 120. In this embodiment, a motion detector sensor 24 is utilized at step 122. Specifically, if motion is not detected then the process continues to step 124 and the conserve duty cycle is initiated. Next, at step 126, the controller determines whether a user has been detected or not. If not, then the process returns to step 122 and the conserve duty cycle is maintained. However, if at step 126 the controller and sensor 21 detects the presence of a user then a dispensing event is initiated at step 128 or upon completion of the process returns to step 122. If at step 122 motion is detected, then the sensor is energized utilizing a normal duty cycle at step 130. Upon completion of step 130, the process goes to step 126 to determine whether a user is detected or not.

FIG. 4 provides for two main operational loops depending upon whether a user is detected by motion or if motion is generally detected in the area proximal the dispenser. Accordingly, if numerous people are entering and exiting a certain area where a dispenser is located then the dispenser will utilize a normal duty cycle so as to be readily available for periods of use. However, if motion is not detected readily by the motion detector, then the dispenser will operate with a conserve duty cycle and, as such, conserve battery power. For the embodiments set out in FIGS. 3 and 4, they may use the same duty cycles as set out for the embodiment presented in FIG. 2. Since only two different duty cycles are used, it will be appreciated that in general the conserve duty cycle operates the sensor(s) less frequently than in the normal duty cycle. However, the duty cycles may be set to operate at different rates than for the embodiment described in relation to FIG. 2.

Based upon the foregoing, the advantages of the present invention are readily apparent. It will be appreciated that the sensors associated with the dispenser operate with a reduced duty cycle but that the dispenser does not turn completely off. Additionally, the duty cycle immediately increases after a dispensing event to rapidly supplement or supply subsequent doses of fluid. Moreover, the present invention or present dispenser is advantageous in that it maintains the preferred duty cycle until the consumption rate decreases and/or the sensor device indicates the duty cycle should be reduced. In one embodiment, the duty cycle requires no other sensors to indicate that a reduced duty cycle may be desirable other than its own timer indicating that the consumption rate has dropped off. These methodologies are advantageous in that reduced power consumption through power management can be obtained without additional cost in the embodiment where other sensors are not required. This device also provides for improved response time when normal use or heavy use is indicated resulting in dispensing more soap and more satisfied customers. This determination can be made by actual usage. Accordingly, if a facility leaves their lights on for 24 hours a day and no one uses the dispenser overnight, the dispenser still saves power. However, the other embodiments may be provided with additional sensors so as to provide for quicker response times in contrast to the one embodiment which may initially have a slow response time.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

The invention claimed is:

1. A method for managing power consumption of a battery-powered device, comprising:
   providing a battery-powered device that must remain in a condition to detect the presence of a user with a sensor so as to dispense a product, wherein detection of the user is a triggering event;
   setting a duty cycle of said sensor to a first range;
   starting a timer, setting said duty cycle to a second range, and dispensing the product upon detection of said triggering event;
   checking for the presence of another triggering event with said duty cycle set to said second range;
   repeating the checking step if said timer has not lapsed;
   returning to said setting said duty cycle of said sensor to said first range when said timer has lapsed;
   starting another timer upon detection of another triggering event and setting said duty cycle to a third range;
   checking for the presence of another triggering event with said duty cycle set to said third range;
   repeating the step of checking for another triggering event if said another timer has not lapsed;
   re-starting said another timer upon detection of said another triggering event;
   repeating the step of checking for another triggering event if said another timer has lapsed;
   re-starting said timer upon lapsing of said another timer; and
   re-setting said duty cycle to said second range.

2. The method according to claim 1, further comprising:
   setting said first range to about once every two seconds;
   setting said second range to about two to four times per second; and
   setting said third range to about six to eight times per second.

3. The method according to claim 1, further comprising:
   setting said timer anywhere between thirty minutes to two hours; and
   setting said another timer anywhere between five minutes to thirty minutes.

4. The method according to claim 1, further comprising:
   dispensing a product upon detection of any triggering event.

5. The method according to claim 1, further comprising:
   configuring said battery-powered device as a hands-free dispenser that dispenses a fluid.

6. A method for managing power consumption of a battery-powered dispenser, comprising:
   providing a battery-powered device that must remain in a condition to detect the presence of a user with a sensor so as to dispense a product;
   setting a duty cycle of said sensor to a first range;
   checking a detected characteristic of another sensor after checking for a triggering event by said sensor;
   dispensing a product upon detection of said triggering event by said sensor;
   adjusting said duty cycle to a second range depending upon a status of said detected characteristic present;
   detecting a time value with said another sensor to determine whether a predetermined period of time has lapsed;
   detecting said triggering event with said sensor;
   adjusting said duty cycle to said second range if said predetermined time period has lapsed;
   adjusting said duty cycle to a third range if said predetermined time period has not lapsed and said sensor detects another triggering event;
   detecting another time value with said another sensor to determine whether another predetermined period of time has lapsed; and
   maintaining said third range duty cycle if said another time period has not lapsed and resetting said duty cycle to said second range if said another time period has lapsed.

7. The method according to claim 6, further comprising:
   resetting said time period after said another time period has lapsed.

8. A method for managing power consumption of a battery-powered dispenser, comprising:
   providing a battery-powered device that must remain in a condition to detect the presence of a user with a sensor so as to dispense a product;
   setting a duty cycle of said sensor to a first range if said detected characteristics exceeds a corresponding threshold value;
   checking a detected characteristic of another sensor, wherein said detected characteristic is either light or sound, after checking for a triggering event by said sensor;
   adjusting said duty cycle to a second range if said detected characteristic is less than said corresponding threshold value, where said second range is less than said first range so as to reduce power consumption of said battery-powered device; and
   dispensing a product upon detection of said triggering event by said sensor regardless of said duty cycle.

* * * * *